(12) United States Patent
Krawczyk et al.

(10) Patent No.: US 7,938,975 B2
(45) Date of Patent: *May 10, 2011

(54) METHOD FOR MAKING A MICRO-FLUID EJECTION DEVICE

(75) Inventors: John W. Krawczyk, Richmond, KY (US); James M. Mrvos, Lexington, KY (US); Girish S. Patil, Lexington, KY (US); Jason T. Vanderpool, Lexington, KY (US); Brian C. Hart, Georgetown, KY (US); Christopher J. Money, Lexington, KY (US); Jeanne M. Saldanha Singh, Lexington, KY (US); Karthik Vaideeswaran, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 963 days.

This patent is subject to a terminal disclaimer.

(21) Appl. No.: 11/780,234

(22) Filed: Jul. 19, 2007

(65) Prior Publication Data

US 2007/0259292 A1 Nov. 8, 2007

Related U.S. Application Data

(60) Division of application No. 10/941,404, filed on Sep. 15, 2004, now Pat. No. 7,271,105, which is a continuation-in-part of application No. 10/803,009, filed on Mar. 17, 2004, now Pat. No. 6,881,677.

(51) Int. Cl.
*G11B 5/127* (2006.01)

(52) U.S. Cl. .......... 216/27; 438/689; 438/694; 438/706; 438/708; 438/778; 216/2; 216/37; 216/58; 216/66

(58) Field of Classification Search .................. 438/689, 438/706, 694, 708, 778; 216/2, 37, 58, 66
See application file for complete search history.

(56) References Cited

U.S. PATENT DOCUMENTS

| | | | |
|---|---|---|---|
| 5,801,083 A | 9/1998 | Yu et al. | |
| 6,143,473 A | 11/2000 | Hoshino et al. | |
| 6,277,752 B1 | 8/2001 | Chen | |
| 6,319,655 B1 | 11/2001 | Wong et al. | |
| 6,409,312 B1 | 6/2002 | Mrvos et al. | |
| 6,479,411 B1 | 11/2002 | Hui et al. | |
| 6,583,062 B1 | 6/2003 | Ma et al. | |
| 6,881,677 B1 * | 4/2005 | Patil et al. | 438/706 |
| 7,271,105 B2 * | 9/2007 | Krawczyk et al. | 438/710 |

OTHER PUBLICATIONS

S. Wolf, Silicon Processing for the VLSI Era, vol. 4, Lattice Press, (2002), p. 228.

(Continued)

*Primary Examiner* — Nadine G Norton
*Assistant Examiner* — Maki A Angadi (57) ABSTRACT

A method of etching a semiconductor substrate. The method includes the steps of applying a photoresist etch mask layer to a device surface of the substrate. A select first area of the photoresist etch mask is masked, imaged and developed. A select second area of the photoresist etch mask layer is irradiated to assist in post etch stripping of the etch mask layer from the select second area. The substrate is etched to form fluid supply slots through a thickness of the substrate. At least the select second area of the etch mask layer is removed from the substrate, whereby mask layer residue formed from the select second area of the etch mask layer is significantly reduced.

16 Claims, 7 Drawing Sheets

OTHER PUBLICATIONS

JP 61-077852A2—to Yoshizawa Takeshi et al. Published Apr. 21, 1986 (English Abstract Only).

JP 61-108135A2—to Nakamura Hiroyuki. Published May 26, 1986 (English Abstract Only).

JP 03-154330A2—to Murayama Akiyo Published Jul. 2, 1991 (English Abstract Only).

JP 04-3024272A2 to Kato Shigeki Published Oct. 26, 1992 (English Abstract Only).

* cited by examiner

METHOD FOR MAKING A MICRO-FLUID EJECTION DEVICE

This application is a division of application Ser. No. 10/941,404, filed Sep. 15, 2004 now U.S. Pat. No. 7,271,105, now allowed, which is a continuation-in-part of application Ser. No. 10/803,009, filed on Mar. 17, 2004, now U.S. Pat. No. 6,881,677.

FIELD OF THE DISCLOSURE

The disclosure relates to micro-fluid ejection devices. More particularly, the disclosure relates an improved method for making micro-fluid ejection devices in order to increase the yield of usable product.

BACKGROUND

Micro-fluid ejection head such as used in ink jet printers are a key component of ink jet printer devices. The processes used to construct such micro-fluid ejection heads require precise and accurate techniques and measurements on a minute scale. Some steps in the ejection head construction process are necessary but can be damaging to the ejection head. Such damage to the ejection head affects the quality of fluid output, and, therefore, has an affect on the value of the ejection device containing the ejection head.

One example of a technique that can result in such damage to an ejection head is the removal of an etch mask layer from photoresist planarization and protection layer on a semiconductor chip in a given ejection head. Ejection heads include a silicon substrate and a plurality of layers including passivation layers, conductive metal layers, resistive layers, insulative layers, and protective layers on the substrate. Fluid feed holes or fluid supply slots are formed in the substrate and various layers in order for fluid to be transferred through the holes or slots to ejection devices on a substrate surface. Such holes of slots are often formed through the semiconductor chip using deep reactive ion etching (DRIE) or mechanical techniques such as grit blasting. A planarization and protection layer is preferably used to smooth the surface of the semiconductor chip so that a nozzle plate may be attached to the substrate more readily. The planarization layer also functions to protect the components between the planarization layer and the surface of the substrate from corrosion.

Before holes or slots are formed in the semiconductor chip containing a planarization layer, the planarization layer is desirably masked by an etch mask layer. Like the planarization layer, the etch mask layer is typically a photoresist material. In order to complete the hole formation process, the etch mask layer must be removed. However, techniques sufficient to remove the etch mask layer may also strip away portions of the planarization layer that are needed for protection of underlying layers. This undesirable effect results in less protection for the semiconductor chip. If, on the other hand, less aggressive stripping of the etch mask layer is conducted, portions of the semiconductor chip are left with an insoluble residue from the etch mask layer which makes the chips unsuitable for use. There is, therefore, a continuing need for a process that will remove substantially all of the etch mask layer without damaging the underlying planarization and protection layer.

SUMMARY

With regard to the above and other objects the disclosure describes a method of etching a semiconductor substrate. The method includes the steps of applying a photoresist etch mask layer to a device surface of the substrate. A select first area of the photoresist etch mask is masked, imaged and developed. A select second area of the photoresist etch mask layer is irradiated to assist in post etch stripping of the etch mask layer from the select second area. The substrate is etched to form fluid supply slots through a thickness of the substrate. At least the select second area of the etch mask layer is removed from the substrate, whereby mask layer residue formed from the select second area of the etch mask layer is significantly reduced.

In another embodiment there is provided a process of forming one or more fluid feed slots in a semiconductor substrate chip for use in a micro-fluid ejection head. The process includes applying a photoresist planarization layer to a first surface of the chip. The planarization layer has a thickness ranging from about 1 to about 10 microns. The photoresist planarization layer is patterned and developed to define at least one ink feed via location therein and to define contact pad areas for electrical connection to a control device. A photoresist etch mask layer is applied to the photoresist planarization layer on the chip. The photoresist etch mask layer has a thickness ranging from about 10 to about 100 microns. The photoresist etch mask layer patterned and developed with a first photomask to define the at least one fluid supply slot location in the photoresist etch mask layer. Deprotection of the photoresist etch mask layer in a select second area of etch mask layer is induced by exposing the select second area to radiation through a second photomask. The exposure through the second photomask is sufficient to deprotect the photoresist etch mask layer in the select second area so that the photoresist etch mask layer in the select second area can be substantially removed with a solvent without substantially affecting the photoresist planarization layer. The chip is dry etched to form at least one fluid supply slot in the defined at least one fluid supply slot location. Subsequently, the photoresist etch mask layer is removed from the planarization layer.

An advantage of certain embodiments described herein may be that select areas of the photoresist etch mask may be essentially completely removed from the substrate with less aggressive techniques. Also, the planarization layer is left relatively smooth and substantially unaltered after the dry etching process and removal of the photoresist etch mask layer. Unlike conventional techniques used to remove etch mask layers, the exemplary embodiments described herein provide removal of substantially all of the photoresist etch mask layer, leaving essentially no residue on critical components such as electrical bond pads thereby improving product yield.

BRIEF DESCRIPTION OF THE DRAWINGS

Further features and advantages of the embodiments described herein will become apparent by reference to the detailed description when considered in conjunction with the figures, which are not to scale, wherein like reference numbers indicate like elements through the several views, and wherein.

DETAILED DESCRIPTION OF EXEMPLARY EMBODIMENTS

Figure 1:
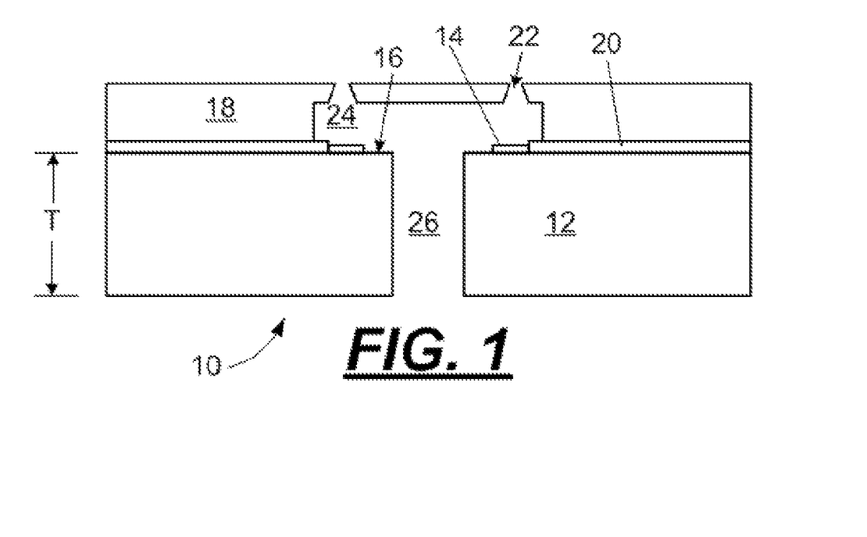
FIG. 1 is a cross-sectional view, not to scale, of a micro-fluid ejection head.
Figure 2:
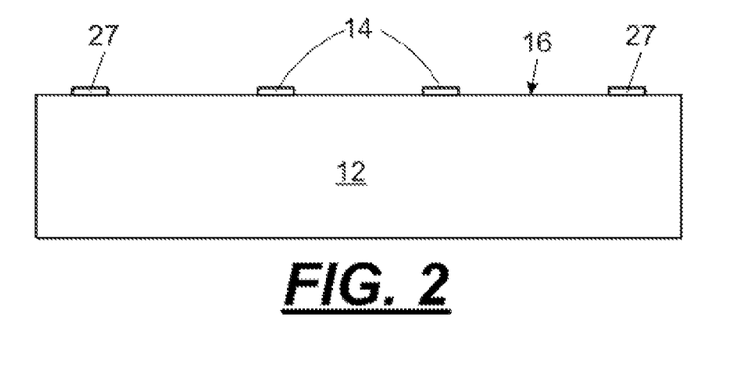
FIGS. 2-8 illustrate steps in a process for forming a micro-fluid ejection head according to one embodiment of the invention.

In one embodiment, there are provided methods for substantially removing an etch mask layer from a surface of a silicon substrate during a manufacturing process for making a semiconductor silicon chip used in micro-fluid ejection devices, such as ink jet printers. With reference to FIG. 1, a micro-fluid ejection head 10 for a micro-fluid ejection device such as an ink jet printer includes a semiconductor substrate 12, preferably made of silicon, having a thickness T. The substrate includes a plurality of fluid ejection devices such as heater resistors 14 on a device surface 16 thereof. The device surface 16 of the substrate 12 also includes various conductive, insulative and protective layers for electrically connecting the heater resistors 14 to a control device for ejecting fluid from the ejection head 10 and for protecting the resistors 14 from corrosion by contact with the fluid.

In order to provide a relatively planar surface for attaching a nozzle plate 18 to the substrate 12, a planarization layer 20 may be applied to the device surface 16 of the substrate 12. An exemplary planarization layer 20 is provided by a radiation curable resin composition that may be spin-coated onto the surface 16 of the substrate 12. A particularly advantageous radiation curable resin composition includes a difunctional epoxy component, a multifunctional epoxy component, a photoinitiator, a silane coupling agent, and a nonphotoreactive solvent, generally as described in U.S. Publication No. 2003/0207209 to Patil et al., the disclosure of which is incorporated by references as if fully set forth herein.

The nozzle plate 18 includes nozzle holes 22 and may include fluid chambers 24 laser ablated therein. In the alternative a thick film layer may be attached directly to the planarization layer 20 and a nozzle plate attached to the thick film layer. In the case of a separate thick film layer, the ink chambers are typically formed in the thick film layer and the nozzle holes are formed in the nozzle plate.

A fluid supply slot 26 is formed through the thickness T of the semiconductor substrate 12 to provide a fluid supply path for flow of fluid to the fluid chambers 24 and heater resistors 14. The fluid supply slot 26 may be provided by an elongate slot or individual holes through the thickness T of the substrate 12. Methods for making fluid supply slots 26 are known and include mechanical abrasion, chemical etching, and dry etching techniques. A particularly advantageous method for forming a fluid supply slot 26 is a deep reactive ion etching (DRIE) process, generally as described in U.S. Pat. No. 6,402,301 to Powers et al., the disclosure of which is incorporated by reference as if fully set forth herein. While the fluid supply slot 26 is shown as having substantially vertical walls, the walls of the fluid supply slot 26 are typically slightly tapered so that the fluid supply slot 26 is wider on one end than on the other end.

With reference to FIGS. 2-11, an exemplary method for making micro-fluid ejection devices according to one embodiment of the disclosure is illustrated. The method includes providing a substrate 12 having a thickness ranging from about 200 to about 800 microns or more. A plurality of layers including insulative, conductive, and resistive materials are deposited on the device surface 16 of the substrate to provide a plurality of heater resistors 14 thereon and electrical tracing to the heater resistors 14. The substrate 12 may also include driver transistors and control logic for the resistors 14 and contact pads 27 for connecting the heater resistors 14 to a control device as by use of a tape automated bonding (TAB) circuit or flexible circuit connected to the contact pads 27.

Figure 3:
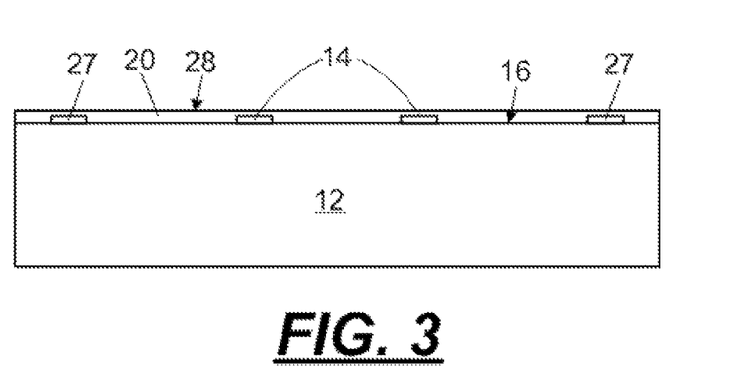

In the next step of the process, shown in FIG. 3, a planarization layer 20, as described above, is applied to the surface 16 of the substrate. The planarization layer may have a thickness ranging from about 1 to about 10 microns or more. Since the planarization layer 20 may be spin-coated onto the substrate surface 16, the layer 20 may be made to completely cover the exposed surface 16 of the substrate 12 including the heater resistors 14 and contact pads 27 as shown. The result after the deposition of the planarization layer 20 is a planarized surface 28.

Figure 4:
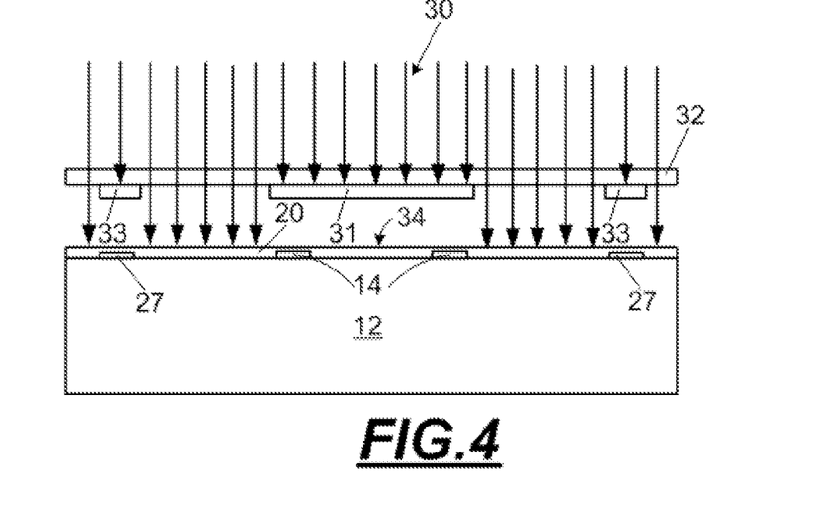
Figure 5:
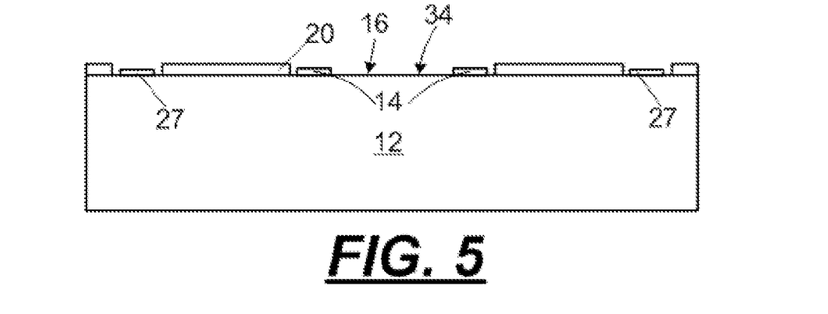

Next, with reference to FIG. 4, the planarization layer 20 is photoimaged to cure selected portions of the layer 20. The selected portions of the planarization layer 20 may be cured using a radiation source 30 such as ultraviolet (UV) radiation. A mask 32 having radiation blocking areas 31 and 33 is used to shield one or more portions and of the planarization layer 20 from the radiation 30 as illustrated so that the shielded portions of the planarization layer 20 remain uncured. The uncured portions are located in areas that are to be developed and removed from the device surface 16 of the substrate 12. Accordingly, the planarization layer 20 atop the resistors 14 and contact pads 27 is removed and the device surface 16 of the substrate is exposed in location 34 for the fluid supply slot 26. The fully cured and developed planarization layer 20 is illustrated in FIG. 5.

Figure 6:
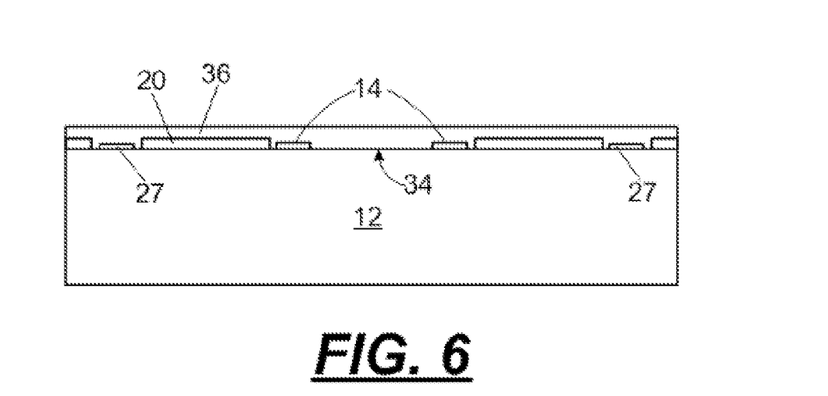

With reference to FIG. 6, an etch mask layer 36 is then applied to the planarization layer 20, the exposed location 34 of the substrate 12 and the exposed contact pads 27. The layer 36 acts as an etch mask layer for a DRIE process for forming one or more fluid supply slots 26 or holes through the thickness T of the substrate 12. The etch mask layer 36 desirably has a thickness ranging from about 10 to about 100 microns, and more particularly, from about 30 to about 70 microns. The thickness of the etch mask layer 36 is not critical provided the thickness is sufficient to protect the planarization layer 20, heater resistors 14, and contact pads 27 during the etching process and not so thick that it inhibits a photoimaging process.

The etch mask layer 36 may be provided by a photoresist material comprised of a polymer containing acid labile protecting groups thereon. An exemplary polymer for use as the etch mask layer 36 includes a protected polyhydroxystyrene material available from Shin-Etsu MicroSi, Inc. of Phoenix, Ariz. under the trade name SIPR 7121M-16, and generally described in U.S. Pat. No. 6,635,400 to Kato et al., the disclosure of which is incorporated herein by reference thereto.

Figure 7:
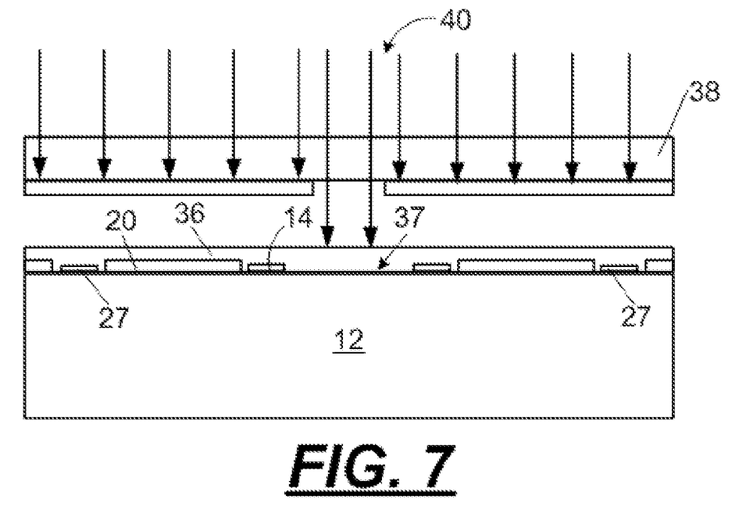
Figure 8:
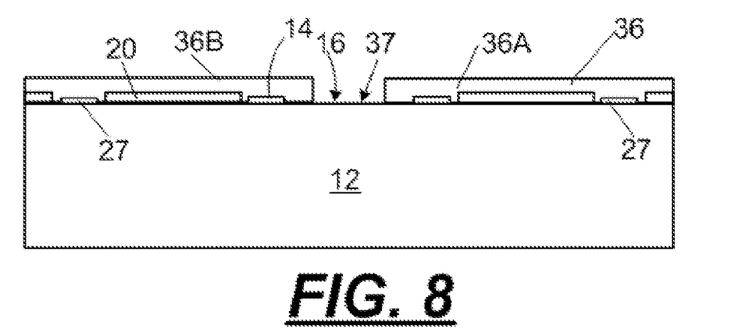

A second irradiation process as illustrated in FIG. 7 is used to provide a select first area 37 in the etch mask layer 36 for forming one or more fluid supply slots 26 through the thickness T of the substrate 12. A second mask 38 is used to photoimage the etch mask layer 36 using a radiation source 40 such as UV radiation. Unlike the process described with respect to FIG. 4, portions of the etch mask layer 36 in the first area 37 subject to radiation are transformed into materials that are readily removed with a suitable solvent rather than cured to prevent removal with a solvent. In the case of use of the photoresist etch mask layer 36 having acid labile protecting groups thereon, irradiation of the etch mask layer 36 causes deprotection of the acid labile protecting groups. Conventional developing solutions may then be used to remove portions of the etch mask layer 36 in area 37 wherein the substrate surface 16 is exposed as shown in FIG. 8.

Prior to etching the substrate 12, a third radiation process is used in conjunction with an etch mask 42 (FIGS. 9A and 9B) to irradiate select second areas 44 of the etch mask layer 36 for subsequent removal after the dry etch process is complete. Accordingly, the etch mask 42 contains substantially transparent areas 46 (FIG. 9B) corresponding to select second areas 44 on the substrate. The mask 42 is configured to expose the select second areas 44 which correspond to the contact pads on the substrate to enable easy removal of the photoresist etch mask layer 36 from the contact pads 27.

Without desiring to be bound by theory, it is well known that exposure of a positive photoresist to UV radiation causes the photoresist to react in such away that solubility of the photoresist is increased in alkaline solvents as well as organic solvents such as acetone. The same is true for both chemically amplified positive photoresist materials as well as standard positive photoresist materials. However, in the embodiments described herein, a chemically amplified positive tone photoresist as described above is used as the etch mask layer 36. Chemically amplified resists (CAR's) contain a phototacid generator (PAG) which upon exposure to the appropriate UV wavelengths will generate an acid and deprotect the photoresist thereby altering the solubility of the photoresist material. In the case of the use of a polyhydroxystyrene material as described above as the etch mask layer 36, exposure to UV radiation induces deprotection of the acid labile groups in the mask layer 36 so that the layer 36 can then be cleanly removed with a solvent in which the mask layer 36 is substantially soluble while the cured planarization layer 20 remains substantially unaffected by the solvent. Suitable solvents include, but are not limited to, compounds in which polyhydroxystyrene is substantially soluble. Examples of such solvents include propyleneglycol monomethyletheracetate (PG-MEA), cyclopentanone, N-methylpyrrolidone, aqueous tetramethyl ammonium hydroxide, acetone, isopropyl alcohol, and butyl cellosolve acetate. Aqueous tetramethyl ammonium hydroxide is particularly suitable for removing a chemically amplified resist.

Figure 9A:
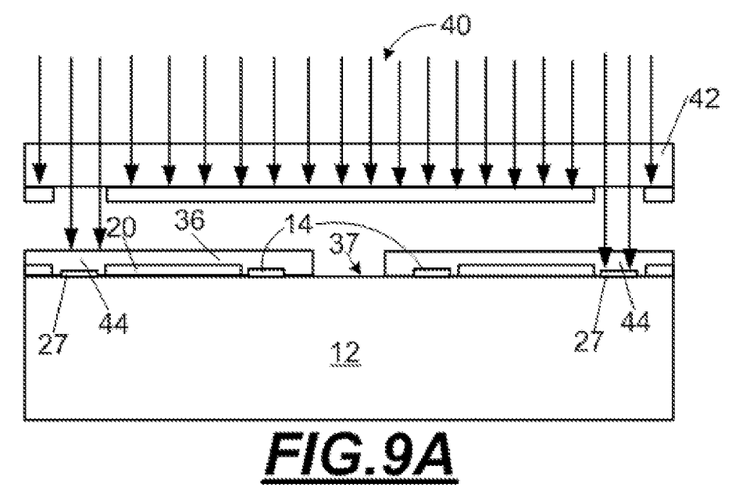
FIG. 9A is a cross-sectional view, not to scale, of an imaging process for activating select areas of a photoresist etch mask layer using radiation according to an embodiment of the disclosure.
Figure 9B:
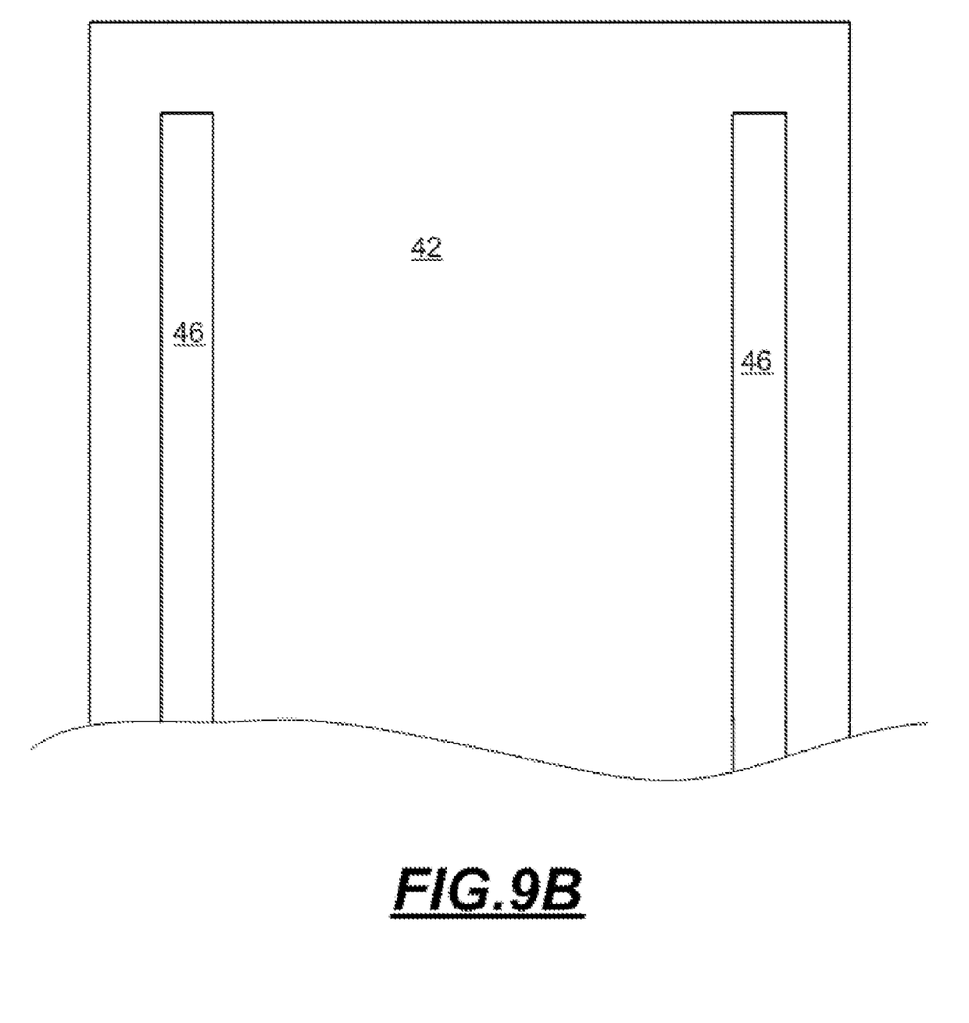
FIG. 9B is a plan view, not to scale, of an etch mask for imaging a photoresist etch mask layer according to the disclosure.
Figure 10:
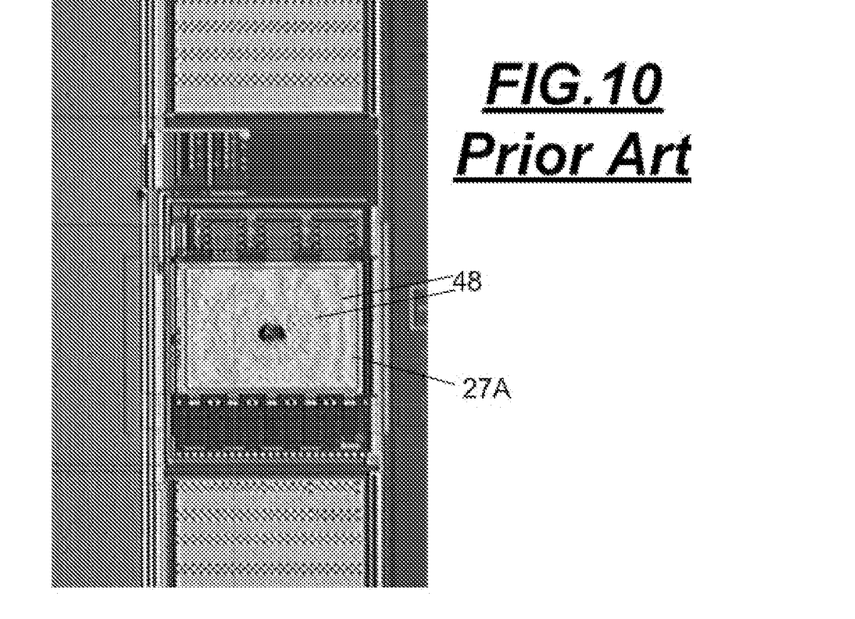
FIG. 10 is a photomicrograph of a contact pad of a substrate containing residue from removal of a photoresist etch mask layer by a prior art method.
Figure 11:
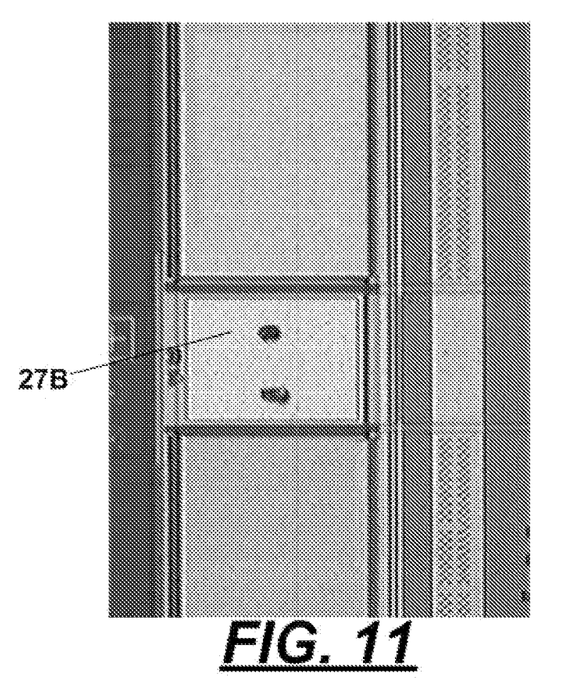
FIG. 11 is a photomicrograph of a contact pad of a substrate after removal of a photoresist etch mask layer treated with radiation according to the disclosure.

It will be appreciated that during a DRIE process, the substrate 12 and the photoresist etch mask layer 36 are exposed to a variety of environmental conditions including UV radiation and heat. The extent of the exposure of the etch mask layer 36 to these conditions affects the stripability of the photoresist etch mask layer 36 upon completion of the etch process. Heat and UV radiation cause the photoresist etch mask layer 36 to interact with contact pads 27, particularly contact pads 27 made of aluminum-copper. A photomicrograph of a contact pad 27A using a prior art etch process having a residue 48 thereon after photoresist stripping is illustrated in FIG. 10. In the prior art process, the step illustrated and described with respect to FIG. 9A is omitted.

It has been observed that if the substrate 12 has the residue 48 on the contact pads 27, electrical leads connected to the contact pads 27 will not adequately bond to the pads 27 causing the ejection head to be discarded. However, if the photoresist etch mask layer 36 is deprotected in select areas 44 by exposing the select areas 44 to UV radiation prior to the DRIE step used to form the fluid supply slots 26, then stripping of the etch mask layer 36 from the substrate 12 and planarization layer 20 is substantially improved as illustrated by the photomicrograph of a contact pad 27B illustrated in FIG. 11.

Exposure of select areas 44 of the photoresist etch mask layer 36 to UV radiation is conducted at an unconventional time. The exposure step, illustrated in FIG. 9A is conducted after the initial imaging and photoresist development steps illustrated in FIGS. 7 and 8 and before a DRIE step illustrated in FIG. 14. Accordingly, the exposed areas 44 of the photoresist etch mask layer 36 are not washed away during the initial development cycle illustrated in FIG. 8.

Blanket exposure of the photoresist etch mask layer 36 without the use of etch mask 42 to provide selective exposure is detrimental to the DRIE etch process as lateral etching of walls for the fluid supply slot 26 in the first area 37 may occur. Accordingly, the etch mask 42 is beneficial in selectively exposing areas of the photoresist etch mask layer 36 prior to DRIE etching.

In the case of chemically amplified resists, there is a short delay time between exposure of the select areas 44 of the photoresist etch mask layer 36 and the DRIE etching step. The delay time should be sufficient to enable the etch mask layer 36 in the select areas 44 to react to the exposure before the DRIE etch process is conducted. Typically, at least a five minute delay time may be required for reaction, depending on the thickness of the etch mask layer 36

Figure 12:
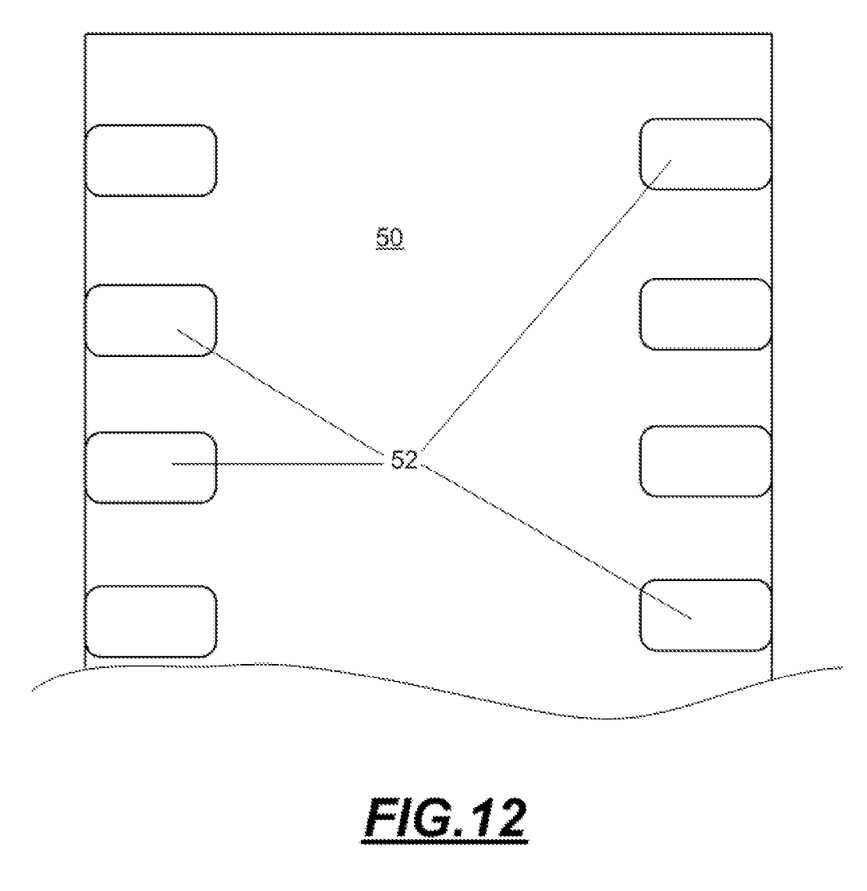
FIG. 12 is a plan view, not to scale, of a etch mask for imaging a photoresist etch mask layer according to another embodiment of the disclosure.

In another embodiment, a mask 50 as illustrated in FIG. 12 may be used to expose the select second areas 44 to UV radiation through transparent areas 52. Rounding the corners of the transparent areas 52 as shown may reduce internal stresses in the photoresist etch mask layer that may cause photoresist cracking.

In yet another embodiment, all areas of the photoresist etch mask layer 36 are exposed to UV radiation, except areas immediately adjacent the select first area 37 for etching the fluid supply slots 26. Accordingly, exposure of the photoresist etch mask layer 36 may include all areas greater than about 0 to about 30 microns from the first area 37. Such an overall exposure has the advantage of increasing etch mask layer 36 stripability over the largest substrate area without substantially contributing to lateral etching of the fluid supply slots 26.

The UV radiation dose and spectrum for exposing the select second areas 44 are chosen such that the UV radiation induces a chemical transformation of the photo active compound in the photoresist etch mask layer 36 (.i.e., deprotection and or rearrangement) thereby reducing interaction between the etch mask layer 36 and the Al—Cu surface of the contact pads 27. Further, since this exposure is done selectively, the lateral etch problem associated with etching the fluid supply slots 26 may be avoided.

Figure 13:
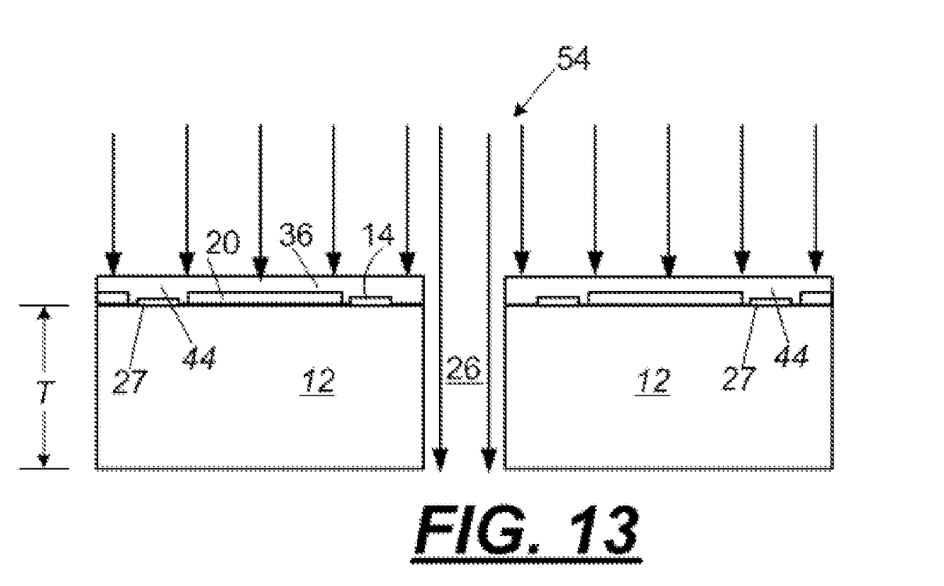
FIG. 13 is a cross-sectional view, not to scale, of a reactive ion etch process according to the disclosure.
Figure 14:
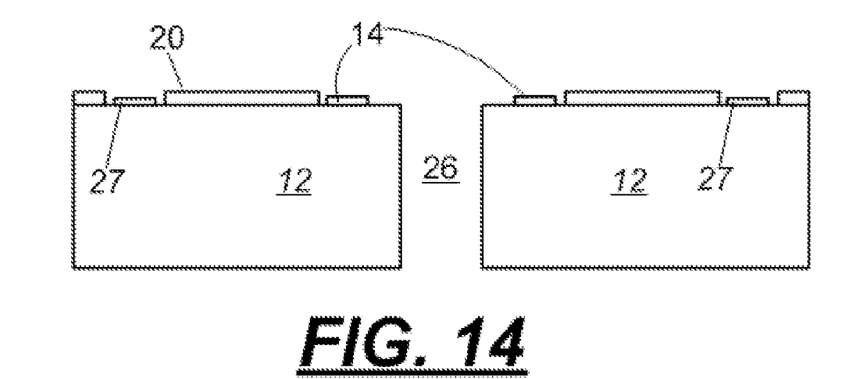
FIG. 14 is a cross-sectional view, not to scale, of a substrate according to the disclosure after removal of an etch mask layer.

After exposing the photoresist etch mask 36 to UV radiation as set forth above, formation of the ink vias 26 is provided by DRIE 54 as described above. FIG. 13 illustrates an exemplary dry etching process used for forming the one or more fluid supply slots 26 through the thickness T of the substrate 12. Once the fluid supply slot 26 is formed through the thickness of the substrate 12, the etch mask layer 36 may be removed as shown in FIG. 14. Finally, with reference to FIG. 1, the nozzle plate 18 is then attached to the planarization layer 20 to provide the micro-fluid ejection head 10 described above.

Having described various aspects and exemplary embodiments of the disclosure and several advantages thereof, it will be recognized by those of ordinary skills that the disclosed embodiments are susceptible to various modifications, substitutions and revisions within the spirit and scope of the appended claims.

What is claimed is:

1. A process of forming at least one fluid supply slot in a substrate chip for use in a micro-fluid ejection head, the process comprising the steps of:
   (a) applying a photoresist planarization layer to a first surface of the chip, the planarization layer having a thickness ranging from about 1 to about 10 microns;
   (b) patterning and developing the photoresist planarization layer to define at least one fluid supply slot location therein and to define contact pad areas for electrical connection to a control device;
   (c) applying a photoresist etch mask layer to the photoresist planarization layer on the chip, the photoresist etch mask layer having a thickness ranging from about 10 to about 100 microns;
   (d) patterning and developing the photoresist etch mask layer with a first photomask to define the at least one fluid supply slot location in the photoresist etch mask layer;
   (e) inducing deprotection of the photoresist etch mask layer in a select second area of etch mask layer by exposing the select second area to radiation through a second photomask sufficient to deprotect the photoresist etch mask layer in the select second area so that the photoresist etch mask layer in the select second area can be substantially removed with a solvent without substantially affecting the photoresist planarization layer;
   (f) dry etching the chip to form at least one fluid supply slot in the defined at least one fluid supply slot location; and
   (g) removing the photoresist etch mask layer from the planarization layer.

2. The process of claim 1 wherein the photoresist etch mask layer comprises a polymer containing acid labile protecting groups.

3. The process of claim 2 wherein the polymer comprises a protected polyhydroxystyrene material.

4. The process of claim 1 wherein the dry etching technique comprises deep reactive ion etching.

5. An ink jet heater chip made by the process of claim 1.

6. A printhead containing an ink jet heater chip of claim 5.

7. The method of claim 1, wherein the select second area comprises an area having rounded corners.

8. The method of claim 1, wherein the photoresist planarization layer comprises a negative photoresist material spin coated onto the substrate.

9. The method of claim 1, wherein the method comprises a delay of at least about five minutes between the deprotection step and the etching step.

10. The method of claim 1, wherein the select second area comprises one or more areas susceptible to residue formation as a result of a reactive ion etch process and a photoresist etch mask removal step.

11. The method of claim 1, wherein the second area is deprotected up to about 200 microns from the second area.

12. The method of claim 1, wherein the second area comprises all areas of the photoresist etch mask layer except areas within about 10 microns of the fluid supply slot location.

13. The method of claim 1, wherein the photoresist etch mask layer comprises a positive photoresist material.

14. The method of claim 1, wherein the step of deprotecting the select second area comprises exposing the select second area of the photoresist etch mask layer to ultraviolet (UV) radiation.

15. The method of claim 14, wherein the positive photoresist material comprises a chemically amplified photoresist material.

16. The method of claim 14, wherein the UV radiation has an energy and wavelength sufficient to cause the second area to undergo a chemical transformation.

* * * * *